(12) United States Patent
Chen (10) Patent No.: US 6,869,820 B2
(45) Date of Patent: Mar. 22, 2005

(54) HIGH EFFICIENCY LIGHT EMITTING DIODE AND METHOD OF MAKING THE SAME

(75) Inventor: Tzer-Perng Chen, Hsinchu (TW)

(73) Assignee: United Epitaxy Co., Ltd., Hsinchu (TW)

( * ) Notice: Subject to any disclaimer, the term of this patent is extended or adjusted under 35 U.S.C. 154(b) by 10 days.

(21) Appl. No.: 10/058,761

(22) Filed: Jan. 30, 2002

(65) Prior Publication Data

US 2003/0143772 A1 Jul. 31, 2003

(51) Int. Cl.[7] ............................................. H01L 33/00
(52) U.S. Cl. ............................ 438/79; 438/98; 438/91
(58) Field of Search ..................... 438/22–47, 479–507; 257/79–103

(56) References Cited

U.S. PATENT DOCUMENTS

| | | | | |
|---|---|---|---|---|
| 6,448,102 B1 | * | 9/2002 | Kneissl et al. | 438/46 |
| 6,468,824 B2 | * | 10/2002 | Chen et al. | 438/29 |
| 6,562,648 B1 | * | 5/2003 | Wong et al. | 438/46 |
| 6,607,931 B2 | * | 8/2003 | Streubel | 438/22 |
| 6,649,437 B1 | * | 11/2003 | Yang et al. | 438/30 |
| 2001/0004534 A1 | * | 6/2001 | Carter-Coman et al. | 438/29 |
| 2002/0093023 A1 | * | 7/2002 | Camras et al. | 257/94 |
| 2003/0003613 A1 | * | 1/2003 | Hseich et al. | 438/2 |

* cited by examiner

*Primary Examiner*—Savitri Mulpuri
(74) *Attorney, Agent, or Firm*—Troxell Law Office PLLC (57) ABSTRACT

A high efficiency light emitting diode (LED) with metal reflector and the method of making the same is disclosed. The metal reflector is composed of at least two layers with one transparent conductive layer and the other highly reflective metal layer. The transparent conductive layer allows most of the light passing through without absorption and then reflected back by the highly reflective metal layer. The transparent conductive layer is selected from one of the materials that have very little reaction with highly reflective metal layer even in high temperature to avoid the reflectivity degradation during the chip processing. With this at least two layer metal reflector structure, the light emitting diode with vertical current injection can be fabricated with very high yield.

6 Claims, 8 Drawing Sheets

HIGH EFFICIENCY LIGHT EMITTING DIODE AND METHOD OF MAKING THE SAME

BACKGROUND OF THE INVENTION

1. Field of the Invention

The present invention relates to a high efficiency light emitting device, and more particularly to a III-V compound semiconductor light emitting diode with a highly reflective metal reflector therein to avoid the light absorption by the substrate.

2. Description of the Prior Art

Figure 1:
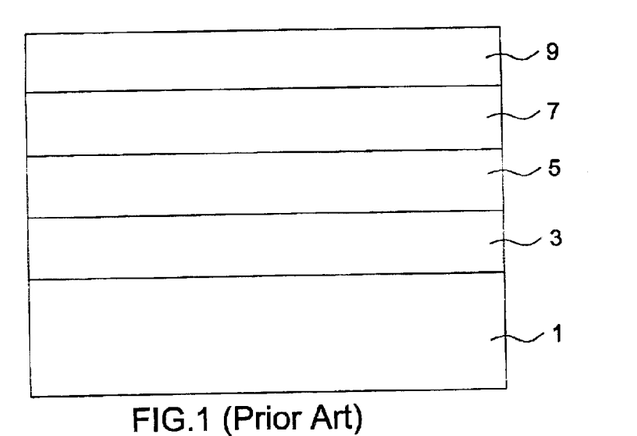
FIG. 1 shows a schematic view of a structure of a conventional light emitting diode.

The conventional AlGaInP LED, as shown in FIG. 1, has a double heterostructure (DH), which is consisted of an n-type $(Al_xGa_{1-x})_{0.5}In_{0.5}P$ lower cladding layer 3 with an Al composition of about 70%–100%, formed on an n-type GaAs substrate 1, an $(Al_xGa_{1-x})_{0.5}In_{0.5}P$ active layer 5 with an Al composition of 0%–45%, a p-type $(Al_xGa_{1-x})_{0.5}In_{0.5}P$ upper cladding layer 7 with an Al composition 70%–100% and a p-type high energy bandgap current spreading layer 9 such as layers of GaP, GaAsP, AlGaAs or ZnO. However, the portion of the light emits from the active layer 5 towards the substrate will be totally absorbed by GaAs substrate 1. Therefore, the external quantum efficiency of this kind of conventional AlGaInP LED is small. Besides, the thermal conductivity of GaAs is only about 44 W/m-° C. The low thermal conductivity of the GaAs substrate 1 is not good enough to dissipate the heat generated.

Figure 2:
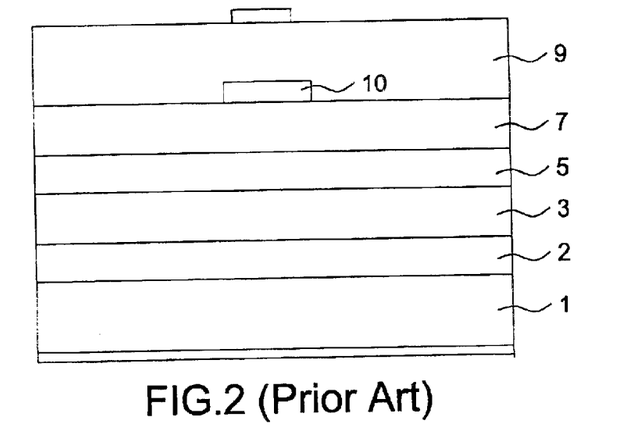
FIG. 2 shows a light emitting diode with DBR structure to reflect the light emitted from the active layer.

To overcome the substrate absorption problem, several conventional LED fabrication technologies have been disclosed. However, those conventional technologies still have several disadvantages and limitations. For example, Sugawara et al. disclosed a method published in Appl. Phys. Lett. Vol. 61, 1775–1777 (1992), The LED structure is similar to the FIG. 1, thus, in FIG. 2, the similar function layers are labeled with the same reference numerals. Sugawara et al. added a distributed Bragg reflector (DBR) layer 2 in between the GaAs substrate 1 and lower cladding layer 3 so as to reflect those light emitted toward the GaAs substrate 1, as shown in FIG. 2. Further they added a blocking layer 10 to enhance current spread. However, the maximum reflectivity of the DBR layer 2 used in AlGaInP LED is only about 80% and the reflectivity thereof also depends on the reflection angle. The DBR layer 2 can only effectively reflect the light vertically emitted towards the GaAs substrate 1, so that the improvement of external quantum efficiency is limited.

Figure 3:
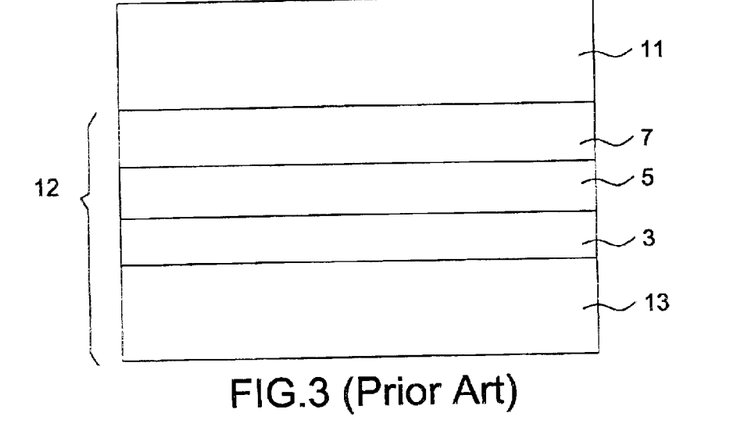
FIG. 3 shows a light emitting diode with transparent substrate made by wafer bonding technology.

Kish et al. disclosed a wafer-bonded transparent-substrate (TS) $(Al_xGa_{1-x})_{0.5}In_{0.5}P/GaP$ light emitting diode [Appl. Phys. Lett. Vol. 64, No. 21, 2839 (1994); Very high efficiency semiconductor wafer-bonded transparent-substrate $(Al_xGa_{1-x})_{0.5}In_{0.5}P/GaP$]. As shown in FIG. 3, a transparent-substrate 13 (TS) is replaced for the GaAs absorption substrate (not shown). The TS AlGaInP LED was fabricated by growing a very thick (about 50 um) p-type GaP window layer 11 formed on epi-layers light emitting structure 12 (0.75 mm p-type cladding layer 3 of $Al_{0.5}In_{0.5}P$/active layer 5 of $Al_xGa_{1-x})_{0.5}In_{0.5}P$/1 mm n-type cladding layer 7 of $Al_{0.5}In_{0.5}P$ with GaAs as temporary substrate by using hydride vapor phase epitaxy (HVPE). Subsequently, the temporary n-type GaAs substrate was selectively removed using conventional chemical etching techniques. After removing the GaAs substrate, the LED epilayer structure 12 is then bonded to an 8–10 mil thick n-type GaP substrate 13. The resulting TS AlGaInP LED exhibits a two fold improvement in light output compared to absorbing substrate (AS) AlGaInP LEDs. However, the fabrication process of the TS AlGaInP LED is too complicated. Therefore, it is difficult to manufacture these TS AlGaInP LEDs in high yield and low cost.

Figure 4A:
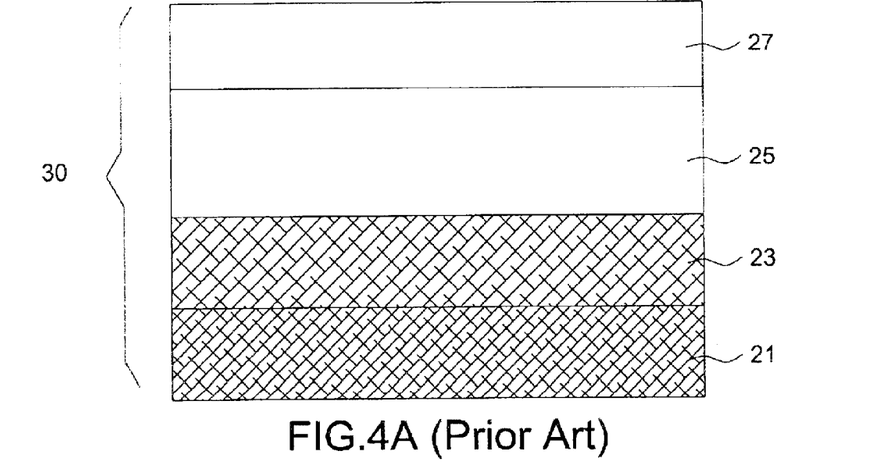
FIG. 4 shows a mirror-substrate AlGaInP/metal/SiO$_2$/Si LED fabricated by wafer-fused technology.
Figure 4B:
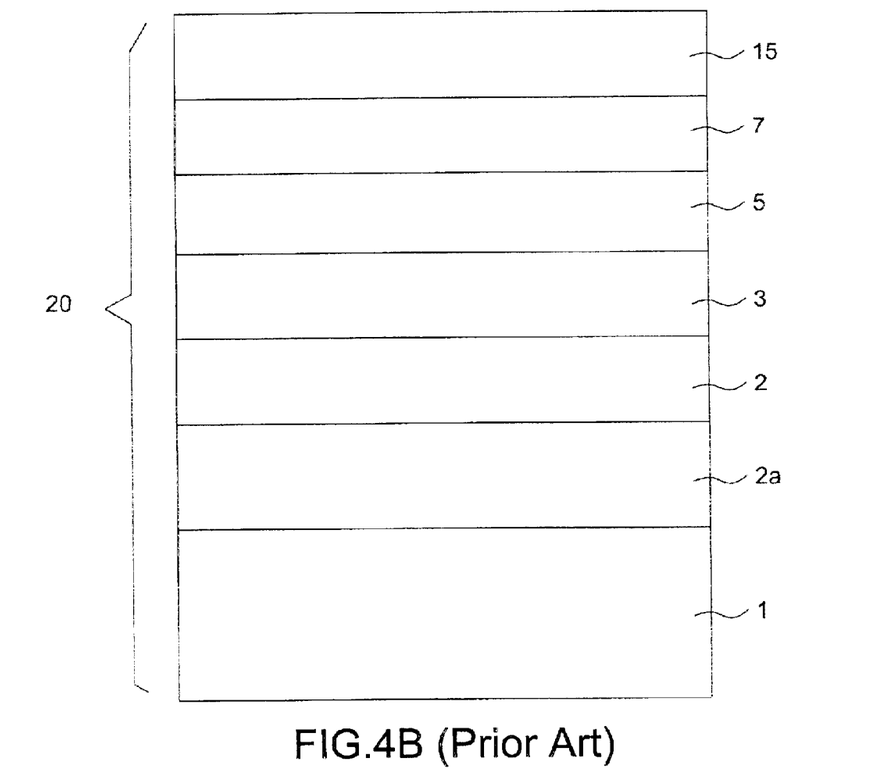
Figure 4C:
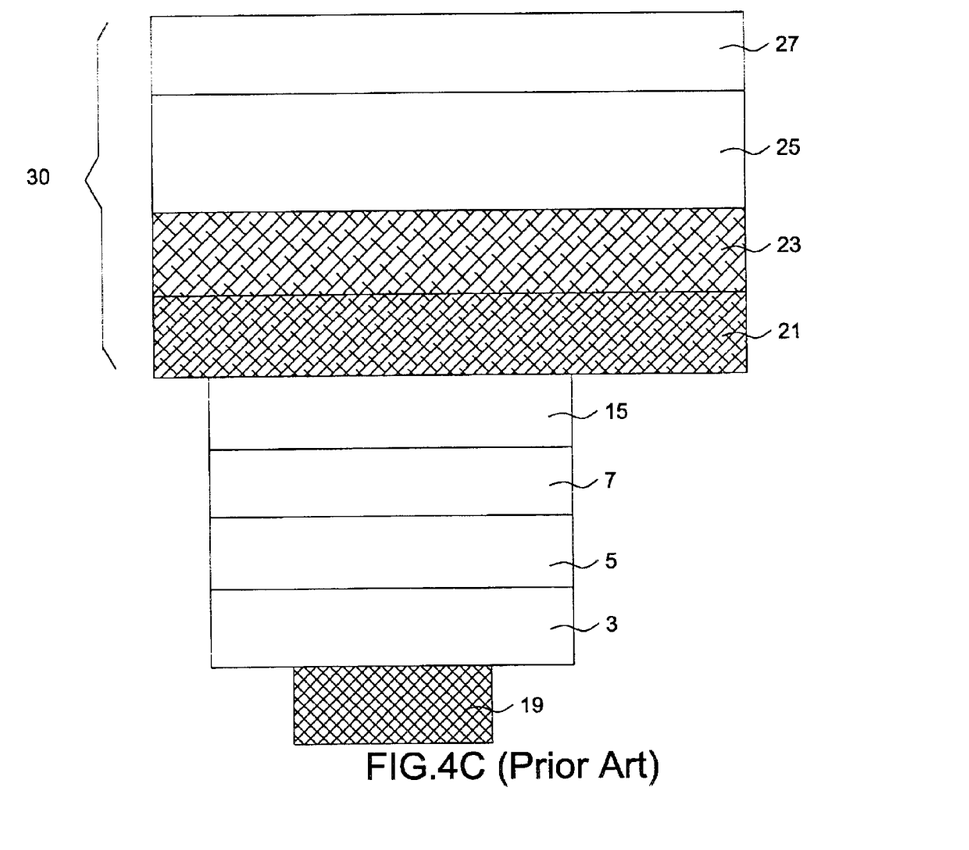

Horng et al. reported a mirror-substrate (MS) AlGaInP/metal/$SiO_2$/Si LED fabricated by wafer-fused technology [Appl. Phys. Lett. Vol. 75, No. 20, 3054 (1999); AlGaInP light-emitting diodes with mirror substrates fabricated by wafer bonding][J Electronic Materials, Vol. 30, No.8, 2001, 907; Wafer bonding of 50-mm-diameter mirror substrates to AlGaInP light-emitting diode wafers]. Please refer to FIG. 4A, They used the AuBe 23/Au 21 of about 100 nm/150 nm in thickness as a mirror layer and adhered to $SiO_2$ 25/Si substrate 27 to form a mirror substrate 30. The LED epi-layers 20 is shown in FIG. 4B, which is similar to that shown in FIG. 2, but has a GaAs buffer layer 2a in between an n-type GaAs substrate 1 and an n-type DBR layer 2 of AlGaAs/GaAs, and a p-type GaAs capping layer 15 replaces for current spreading layer 9. The mirror substrate 30 is then binded with the LED epi-layers 20 by bonding the Au layer 21 with p-type capping layer 15. After that, the GaAs substrate 1, the GaAs buffer layer 2a, and the DBR layer 2 are removed. Finally an n-type electrode of AuGeNi/Au metal layer 19 is formed on the n-type cladding layer 3. The resulting structure is shown in FIG. 4C.

The purpose of the mirror substrate 30 is to reflect the light emitted towards the absorption substrate and to provide a better thermal conductivity silicon substrate. The silicon of mirror substrate 30 has a thermal conductivity of about 124–148 W/m-° C., and thus it can improve the heat dissipation problem. However, the top surface of AlGaInP LED epi-wafer 20 normally has some hillocks (not shown). These hillocks can result in incomplete bonding regions while the LED epi-layers portion 20 bonds with the supporting substrate 30 these regions will be problematic and present deteriorated performance of LED chips. Moreover, to achieve lower contact resistance, the n-type ohmic contact 19 must be annealed at a temperature higher than 400° C. At such a higher temperature annealing, the reflectivity of the Au mirror layer 21 may seriously degrade because of the reaction between Au layer 21 and the III-V compound semiconductor: the p-type GaAs capping layer 15. Besides, both p-electrode 21 and n-electrode 19 are formed on the same side, so that the chip size is larger than conventional LED chip that has p-electrode on one side and n-electrode on the other side.

Figure 5:
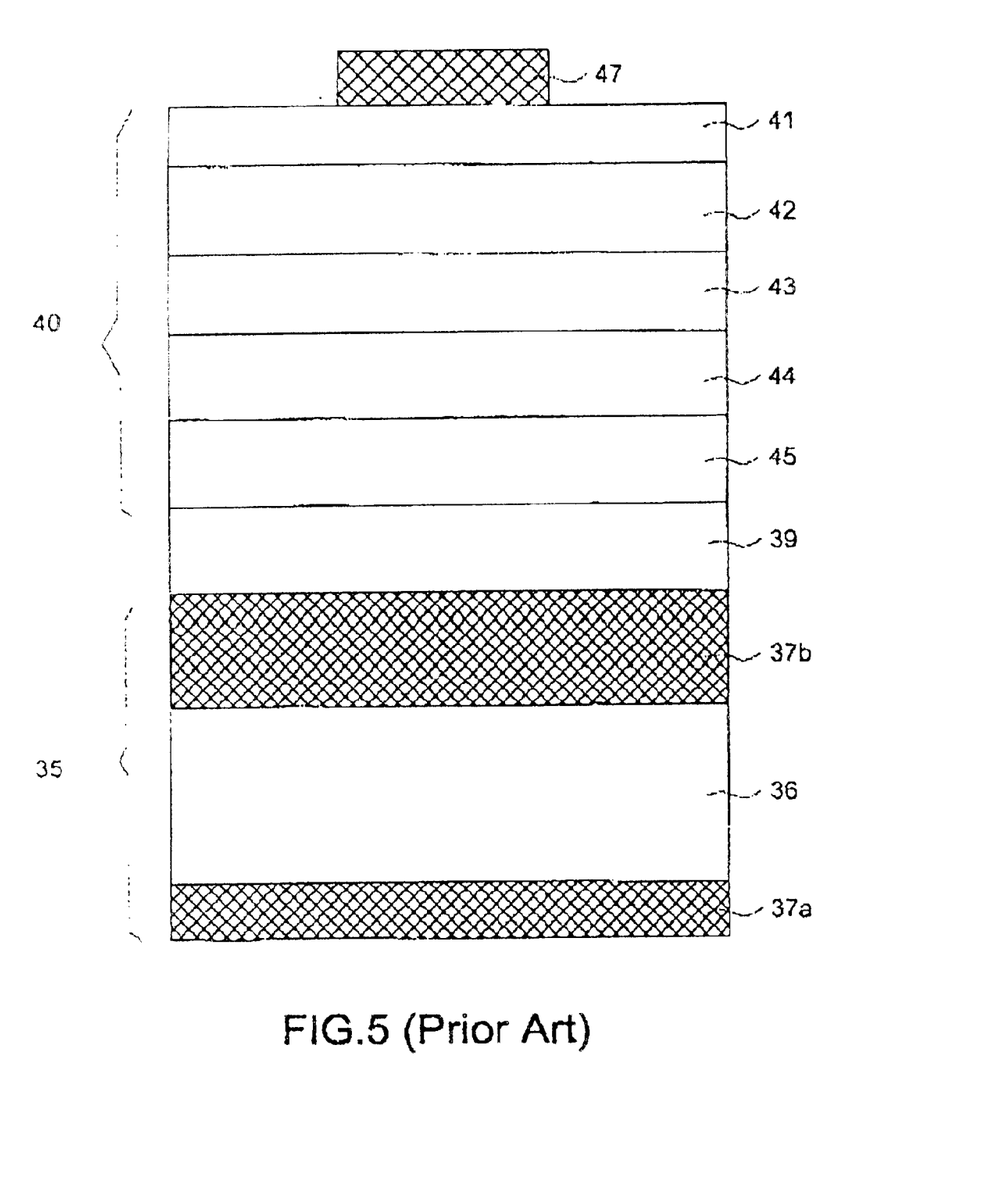
FIG. 5 shows a light emitting diode with metal reflector structure and is bonded to a conductive silicon substrate.

Chen et al. in U.S. Pat. No. 6,319,778 B1 disclosed a light emitting diode with metal reflector to increase the light output. The LED structure is shown in FIG. 5, is composed of a LED epi-layers 40 and a supporting substrate 35 bonded by a low temperature solder layer 39. The LED epi-layers 40 is consisted of an n-type cladding layer 41, an AlGaInP active layer 42, a p-type cladding layer 43, a p-type GaAs capping layer 44 and a p-type ohmic contact layer 45. The supporting substrate 35 is comprised an impurity heavily doped silicon substrate 36 coated with metal layers 37a and 37b on both sides of the silicon substrate 36. Therefore, a vertical injection current flow LED structure with n-electrode on one side (an n-type ohmic contact metal 47 and p-electrode on the other side 37a) can be achieved. However, the n-ohmic contact metal 47 is deposited after bonding. To achieve lower contact resistance, a high temperature annealing process is necessary but will degrade the reflectivity of metal reflector 37b. In order not to sacrifice the reflectivity, the n-ohmic contact metal 47 can't be annealed in higher temperature. Therefore, a lower n-type ohmic contact 47 resistance can't be achieved.

SUMMARY OF THE INVENTION

The present invention provides a high efficiency light emitting diode. The light emitting diode comprises an LED epitaxial structure which has a plurality of III-V compound semiconductor layers grown on a lattice matched substrate and can generate light in responsive to injection current, a metal reflector composed of a transparent conductive oxide layer and a highly reflective metal layer is deposited on LED layers, a silicon substrate has a first ohmic contact metal layer on one side and a second ohmic contact metal layer on the other side and a solder layer for bonding the LED epitaxial layers and the silicon substrate together.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

As described above, the conventional AlGaInP LEDs have many disadvantages, and thus the present invention provides a newly LED structure which comprises a transparent conductive oxide layer in between metal reflector layer and the upper side of light emitting structure solve those disadvantages present in conventional LEDs and will be described in detail as below.

Figure 6A:
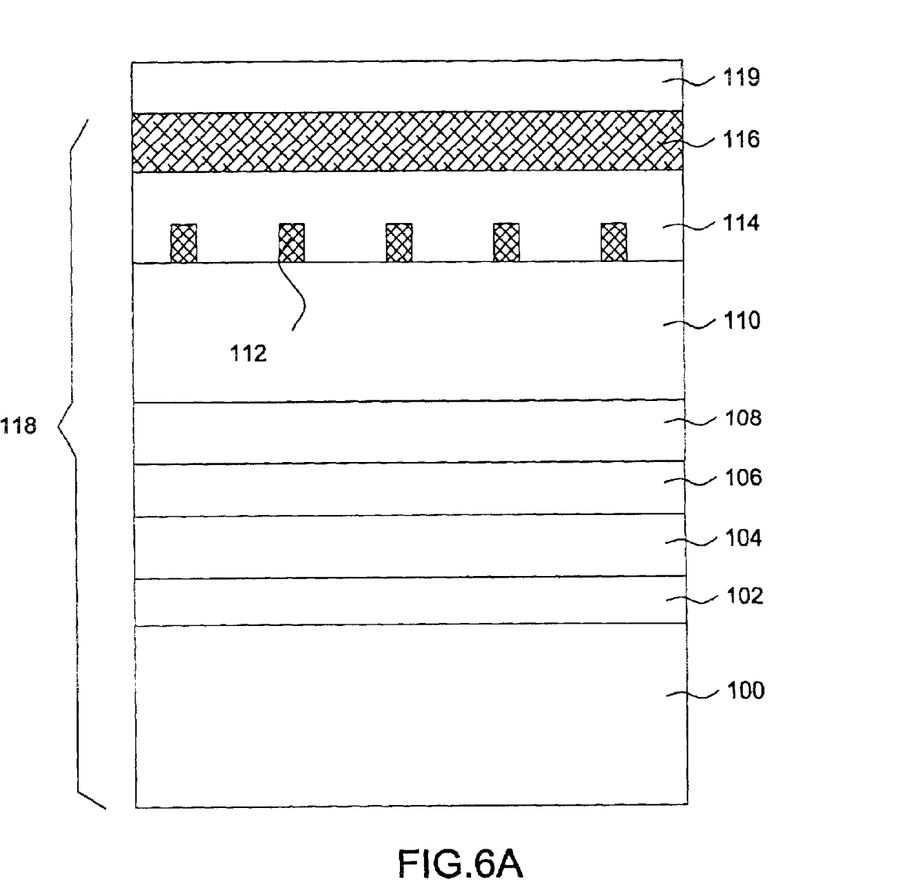
FIGS. 6A-6C shows a schematic view of an AlGaInP light emitting diode structure according to the present invention.

Referring to FIG. 6A, an epitaxial structure 118 of a light emitting structure is consisted of a temporary GaAs substrate 100, an etching stop layer 102, an n-type $(Al_xGa_{1-x})_{0.5}In_{0.5}P$ lower cladding layer 104 with an Al composition of about 50%–100%, an $(Al_xGa_{1-x})_{0.5}In_{0.5}P$ active layer 106 with an Al composition of about 0%–45%, a p-type $(Al_xGa_{1-x})_{0.5}In_{0.5}P$ upper cladding layer 108 with an Al composition of about 50%–100%, a p-type ohmic contact layer 110.

The material of the etching stop layer 102 can be selected from any III-V compound semiconductor material that has a lattice matched with that of the GaAs substrate 100. The material of the etching stop layer 102 has an etching rate much smaller than that of the GaAs substrate 100 while using an etchant mixture such as $5H_3PO_4:3H_2O_2:3H_2O$ or $1NH_4OH:35H_2O_2$, to remove GaAs substrate 100. For example, GaInP or AlGaAs can be a good candidate of the etching stop layer 102. The etching stop layer 102 must also have a high carrier concentration in order to form ohmic contact easily. The preferred carrier concentration of etching stop layer 102 is higher than $1\times10^{18}$ cm$^{-3}$.

The p-type ohmic contact layer 110 (hereafter called transparent ohmic contact layer 110) should have a high transparency to light emitted by the active layer 106 and thus must have an energy band gap larger than that of the active layer 106. The transparent ohmic contact layer 110 must also have a high carrier concentration therein in order to form a lower resistance ohmic contact. Preferably, the transparent ohmic contact layer 110 can be any III-V compound of semiconductors which satisfy forgoing conditions. For example, LED with light emitting in a wavelength range of about 590 nm–650 nm, AlGaAs or GaAsP is a good choice as the material of p-type ohmic contact layer 110. In case of wavelength up to 560 nm, a GaP layer is good candidate. The carrier concentration of transparent ohmic contact layer 110 higher than $1\times10^{18}$ cm$^{-3}$ is preferred.

Thereafter, a p-type ohmic contact metal grid pattern or mesh pattern 112 (hereinafter called ohmic contact metal patterned layer 112), such as Au—Be, Au—Zn or Cr—Au, is formed on the p-type ohmic contact layer 110 so as to further prompt the current evenly distributed. The ohmic contact metal patterned layer 112 is formed either through the steps sequence of forming a p-type ohmic contact metal layer atop the p-type ohmic contact layer 110, forming a photoresist pattern, and performing an etching step to pattern the p-type ohmic contact metal layer and performing the photoresist removal or through the steps sequence of forming a photoresist with a grid or a mesh pattern, deposing a p-type ohmic contact metal layer, and then performing a lift off step to remove the portion of poor bonding metal layer and striping the photoresist finally.

The higher coverage ratio of ohmic contact metal patterned layer 112 will reduce the light output but it will reduce the forward voltage of light emitting diode. Thus, to compromise between the light output and contact resistance, the coverage ratio of ohmic contact metal patterned layer 112 112 less than 10% is preferred. Thereafter, the resulting LED structure is then annealed in a high temperature of about 350–600C to achieve lower contact resistance. Then a transparent conductive oxide layer 114 and a highly reflective metal layer 116 are successively deposited on the transparent ohmic contact layer 110. The transparent conductive layer 114 according to the invention is selected from one of the materials that have high conductivity, good transparency and little reaction with reflective metal layer 116 even in a high temperature. For example, In$_2$O$_3$, SnO$_2$, CdO, ZnO, ITO, CTO, CuAlO$_2$, CuGaO$_2$ and SrCu$_2$O$_2$ are good candidates. The highly reflective metal layer 116 can be selected from Au, Al or Ag. These three metals all have reflectivity higher than 90% in the wavelength range from 560 nm to 650 nm. The major improvement of the present invention is the adoption of this two layers structure metal reflector to prevent the reflective metal layer 116 from reaction with the transparent ohmic contact layer 110. Normally, the reflective metals such as Au, Al or Ag will react with most of the III-V compound semiconductor materials in high temperature. The higher the temperature the more serious the reaction is. When the reflective metal 116 reacted with the high conductivity transparent ohmic contact layer 110, the reflectivity of the reflective metal layer 116 will degrade. Adding an inert transparent conductive layer 114 such as an ITO layer in between can totally avoid the interaction between the reflective metal 116 and the transparent ohmic contact layer 110. Therefore, the reflectivity of the highly reflective metal layer 116 will not degrade during any high temperature processing.

Figure 6B:
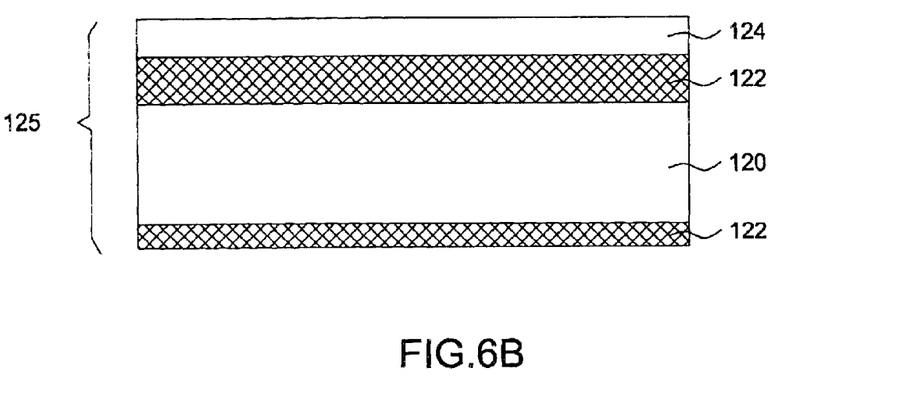

Subsequently, the AlGaInP LED epi-wafer 118 is then bonded to another high thermal and electrical conductive substrate 125. A lot of semiconductors and metals such as Si, SiC, AlN, copper, and aluminum are good candidates for serving as the conductive substrate 125. Especially, the silicon wafer is cheaper and more easily to be lapped, polished and diced. Therefore, the silicon substrate is preferred, as is shown in FIG. 6B. After the silicon substrate 120 is heavily doped with conductive impurities, a metal layer is then coated thereon both sides of silicon substrate 120 to form ohmic contacts, 122. Then, either one side of the ohmic contact metal 122 will bond with the AlGaInP LED epi-wafer 118 by a metal bonding layer 124. The metal bonding layer 124 is one selected from solder or metals or metal silicide such as PbSn, AuGe, AuBe, AuSi, Sn, In, and PdIn. The metal bonding layer 124 is required to provide enough adhesion strength and current conduction. To avoid the reaction between the metal bonding layer and the highly reflective metal layer 116, another diffusion barrier layer 119 can be optionally deposited on the highly reflective metal layer 116. The diffusion barrier layer 119 can be a conductive oxide layer such as ITO, CTO and ZnO or a high melting temperature metal layer such as a layer of W, WN, Mo, or silicide.

In case of without the diffusion barrier layer 119, the highly reflective metal layer 116 should have a thickness higher than that of with diffusion barrier layer 119. Furthermore, the metal bonding layer 124 formed on the ohmic contact metal 122 is for illustration, as shown in FIG. 6B rather than give a limitation. For example, the metal bonding layer 124 can be either formed on the diffusion barrier layer 119 or formed on reflective metal layer 116 before performing the bonding process. Still, in bonding the ohmic contact metal 122 of conductive substrate 120 with reflective metal layer 116, the metal bonding layer can be bonded by the ohmic contact metal itself 122 without the metal bonding layer 124, if the selected ohmic contact metal 122 has a melting point of about 300 to 600° C.

Figure 6C:
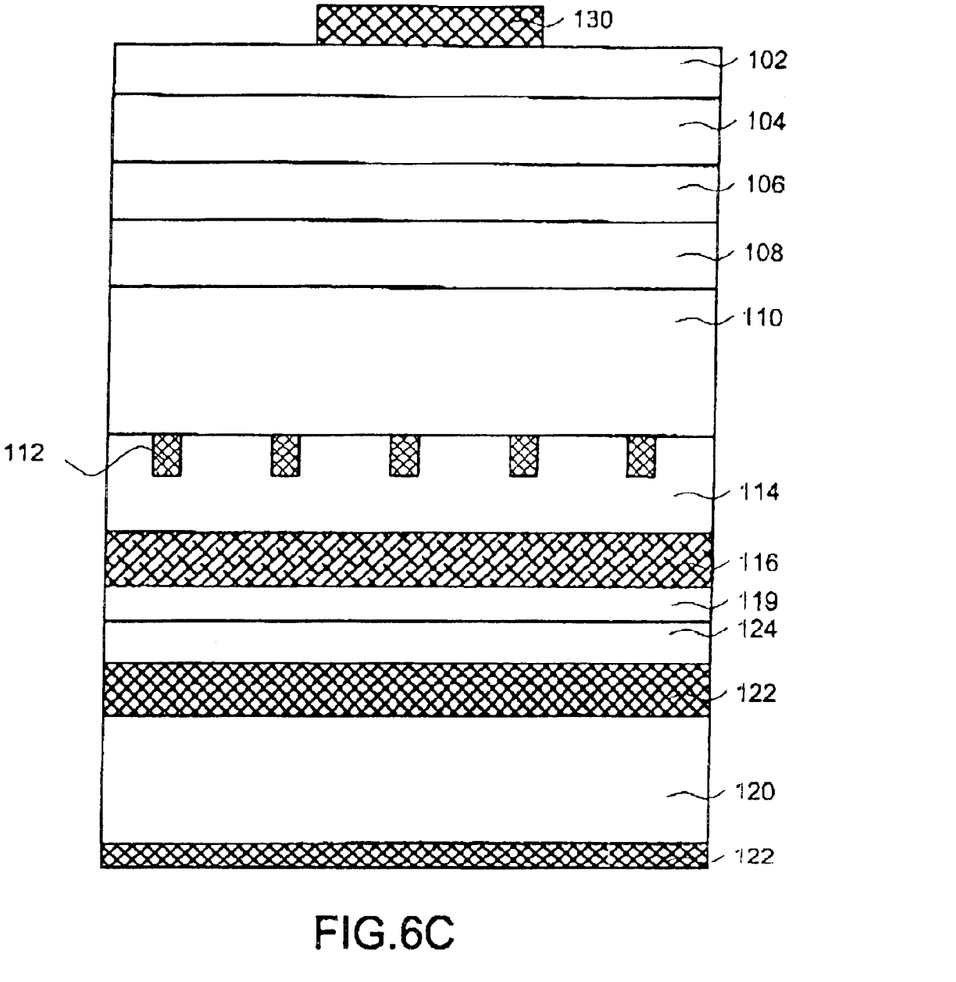

After bonding, the absorption GaAs substrate 100 is removed by mechanical lapping, chemical etching, or reactive ion etching. Then, an n-type ohmic contact 130 is deposited on the etching stop layer 102 and annealed to complete a vertically current conduction AlGaInP light emitting diode with good heat dissipation. The results LED cross-sectional view is shown in FIG. 6C.

The luminous efficiency of the AlGaInP LED according to the present invention is over 30 lm/W in the wavelength range of 585 nm to 630 nm. The brightness of the present invention AlGaInP LED also increases linearly with injection current even above 100 mA. It proves that the Si wafer provides a much better heat dissipation capability than GaAs substrate. The present invention not only applied to AlGaInP LED but also can be applied to other LEDs such as AlGaAs LED, InGaAsP LED, AlGaInN LED or VCSEL devices (vertical cavity surface emitting laser).

Figure 7A:
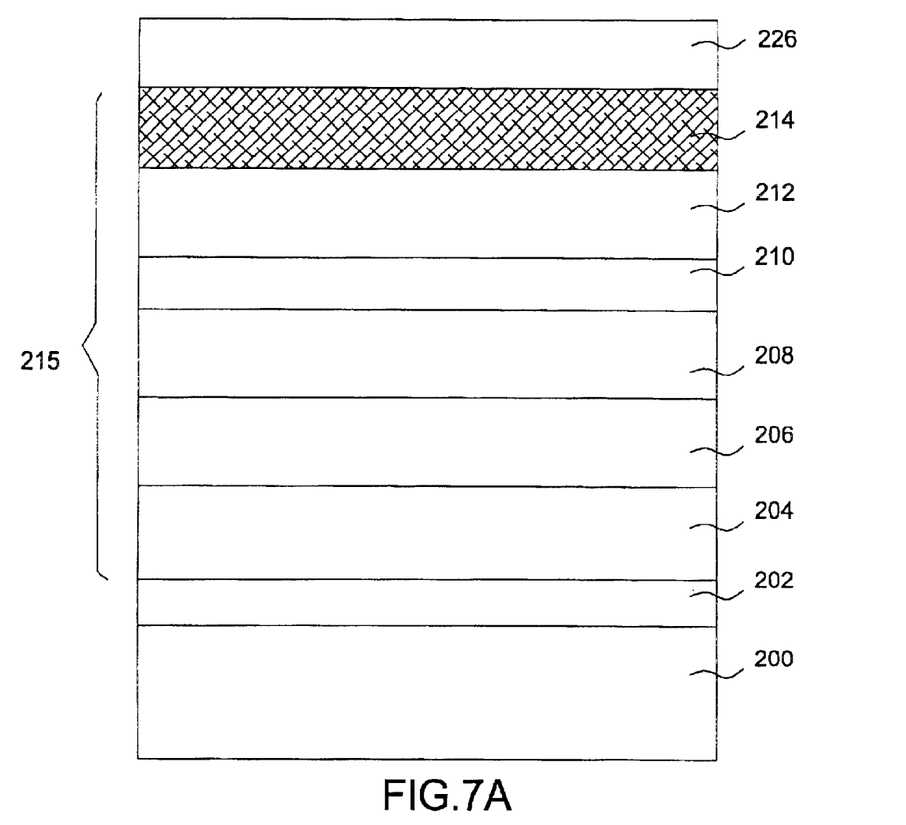
FIG. 7A shows a schematic view of an AlGaInN light emitting structure according to the present invention.

Taking the AlGaInN LED as a second preferred embodiment, an example of the AlGaInN LED epi-layer structure is shown in FIG. 7A. First, an AlGaInN LED epi-layer structure 215 is grown on the temporary Si substrate 200 with a buffer layer 202. The buffer layer 202 can be an AlN amorphous or polycrystalline layer, which is deposited by a sputtering method. The AlGaInN LED structure 215 which comprises of an n-type GaN layer 204, an InGaN multiple quantum well (MQW) 206, and a p-type GaN layer 208 grown by MOVPE (Metal-Organic Vapour Phase Epitaxy) A transparent ohmic contact metal layer (TCL) 210 such as Ni/Au is then deposited on the p-type GaN layer 208 and annealed to form low resistance ohmic contact. Subsequently, a transparent conductive layer 212 and a highly reflective metal layer 214 are successively deposited on the TCL layer 210.

Figure 7B:
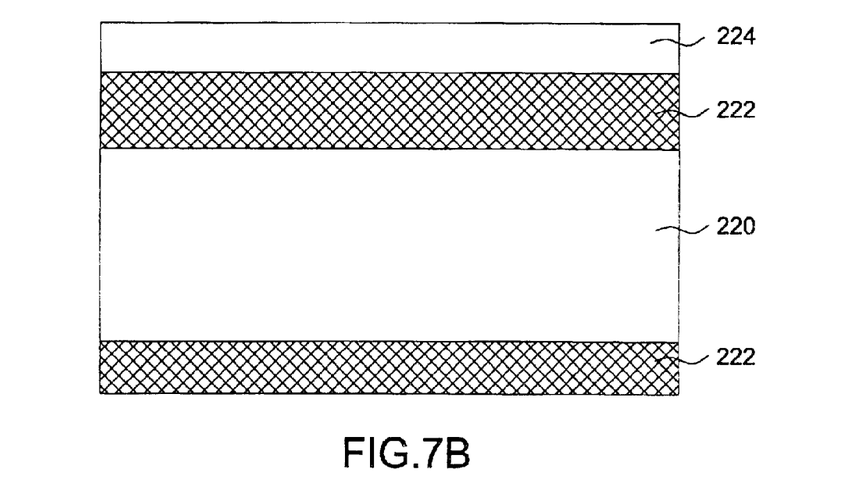
FIG. 7B shows a schematic view of supporting substrate for an AlGaInN light emitting diode
Figure 8:
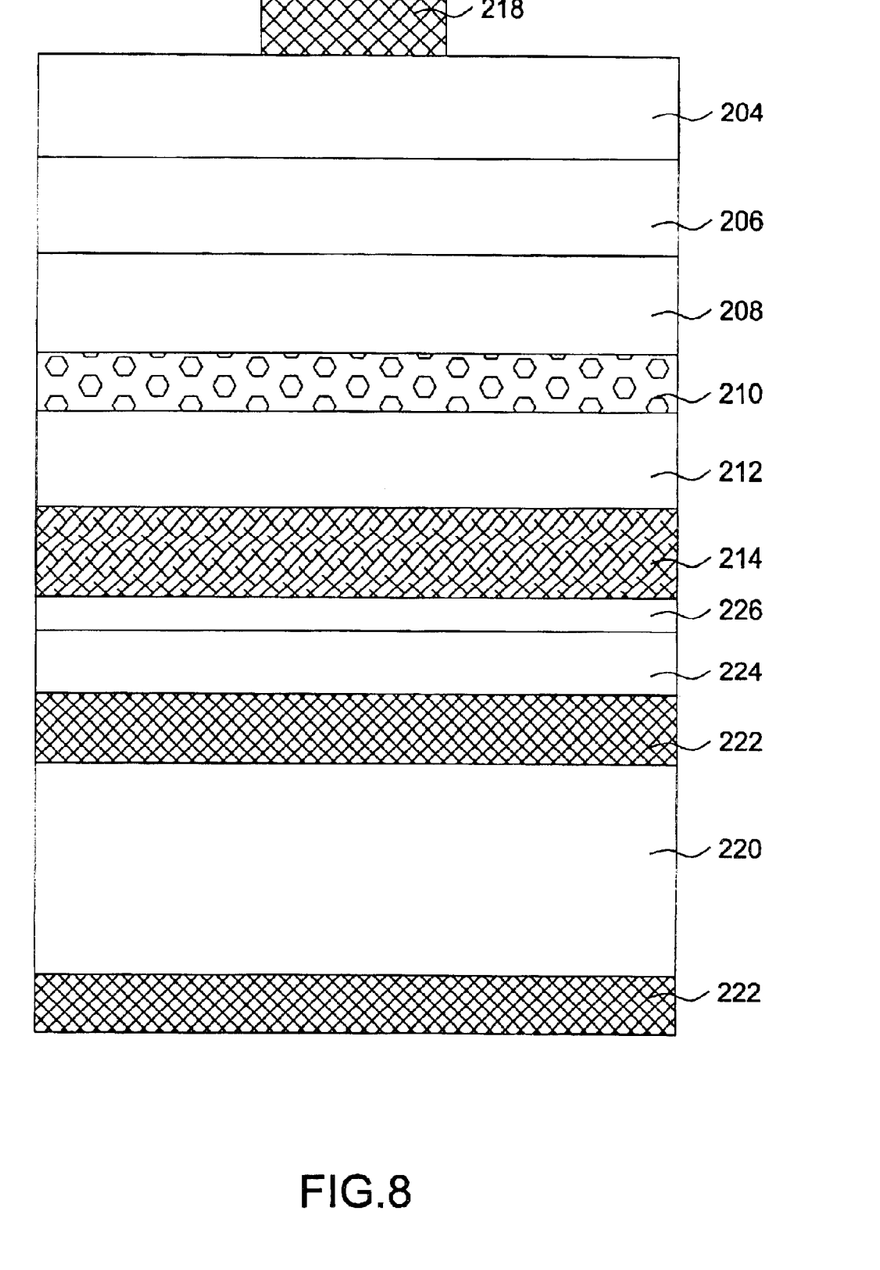
FIG. 8 shows a schematic view of an AlGaInN light emitting diode structure according to the present invention.

Thereafter, the AlGaInN LED epi-layer structure 215 on the temporary Si substrate 200 is bonded to another silicon base substrate 220, as shown in FIG. 7B. Similar to that shown in FIG. 6b, the silicon base substrate 220 has an ohmic contact layer 222 on both surfaces. Before bonding, a conductive oxide layer 226 or a refractory metal layer 226 is optionally deposited on the metal reflective layer 214 to prevent the metal bonding layer 224 from reacting with the reflective metal layer 214. After bonding, the temporary Si substrate 200 and the buffer layer 202 are removed by lapping, polishing, etching or a combination thereof. Because the hardness or chemical properties of Si and AlGaInN are quite different, it is quite easy to remove the Si substrate 200 and the buffer layer 202 and stop at n-type GaN layer 204. Finally, an n-type ohmic contact 218 is deposited on the n-type GaN layer 204 and annealed to complete a vertically current conduction AlGaInN light emitting diode with good heat dissipation. The result is shown in FIG. 8.

The present invention can also be applied to VCSEL. For example, a 650 nm–670 nm AlGaInP VCSEL with GaAs substrate normally can't operate at higher temperature due to carrier leakage and heat dissipation problem. The quality of DBR also is not perfect because small refractive index difference of AlGaAs/AlAs DBR and requiring longer growth time. Using the present invention metal reflector combining with P-DBR, the number of AlGaAs/AlAs P-DBR pairs can be reduced and the growth time can be shorter. The whole VCSEL structure can be bonded to a high thermal conductivity Si substrate; therefore, the high temperature operating characteristics can be improved.

The benefits of the present invention are:

(1) to provide an LED chip structure with vertical current flow and requiring a single wire bonding that results in easy LED assembly and the manufacturing cost can be reduced.

(2) an LED chip size can be greatly reduced and compatible with the trend toward miniaturization, particularly in surface mount LED applications and saving the material cost.

(3) with good heat dissipation, therefore, the LED has better reliability performance and can be operated at much higher current.

(4) very easy to mass-produce in higher yield and lower cost.

(5) the metal reflector can withstand higher temperature without reflectivity degradation, therefore, allowing more flexibility in chip processing.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation.

What is claimed is:

1. A light emitting diode comprising:
   a conductive base substrate;
   a light emitting structure having a plurality of light emitting layers which generate light in responsive to an injection current;
   a transparent conductive oxide layer formed on said light emitting structure, said transparent conductive oxide layer having one of an ohmic contact metal grid and a dot patterned layer formed therein and atop said light emitting structure;
   a metal reflective layer formed on said transparent conductive oxide layer, said transparent conductive oxide layer being formed to prevent said metal reflective layer from reacting with said light emitting layers while annealing for improving ohmic contact of electrodes of said light emitting diode;

a diffusion barrier layer formed in between said metal reflective layer and a metal bonding layer; and said metal bonding layer formed in between said conductive base substrate and said diffusion barrier layer so as to bond said conductive base substrate and said light emitting structure.

2. The light emitting diode according to claim 1, wherein said conductive base substrate is a heat dissipation and electrical conductive layer selected from the group consisting of copper, aluminum, SiC, AlN and silicon.

3. The light emitting diode according to claim 1, wherein said transparent conductive layer is selected from the group consisting of $In_2O_3$, $SnO_2$, CdO, ZnO, ITO, CTO, $CuAlO_2$, $CuGaO_2$ and $SrCu_2O_2$.

4. The light emitting diode according to claim 1, wherein said metal reflective layer is selected from the group consisting of Au, Al and Ag.

5. The light emitting diode according to claim 1, wherein said metal bonding layer is selected from the group consisting of In, Au—Sn alloy, Au—Si alloy, Pb—Sn alloy and Au—Ge alloy, PdIn.

6. The light emitting diode according to claim 1, wherein said diffusion barrier layer is selected from the group consisting of conductive oxide layer, refractory metal layer, and refractory metal silicide.

* * * * *